(12) United States Patent
Gerlach

(10) Patent No.: US 8,457,170 B2
(45) Date of Patent: Jun. 4, 2013

(54) VERTICAL CAVITY SURFACE EMITTING LASER WITH ACTIVE CARRIER CONFINEMENT

(75) Inventor: Philipp Henning Gerlach, Ulm (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/388,713

(22) PCT Filed: Aug. 3, 2010

(86) PCT No.: PCT/IB2010/053513
§ 371 (c)(1),
(2), (4) Date: Feb. 3, 2012

(87) PCT Pub. No.: WO2011/018734
PCT Pub. Date: Feb. 17, 2011

(65) Prior Publication Data
US 2012/0128020 A1    May 24, 2012

(30) Foreign Application Priority Data
Aug. 10, 2009    (EP) .................................. 09167565

(51) Int. Cl.
*H01S 5/00*    (2006.01)

(52) U.S. Cl.
USPC .................... 372/50.21; 372/50.1; 372/50.11; 372/50.124

(58) Field of Classification Search
USPC ....................... 372/50.21, 50.1, 50.11, 50.124
See application file for complete search history.

(56) References Cited

U.S. PATENT DOCUMENTS

| | | | |
|---|---|---|---|
| 5,132,982 A | 7/1992 | Chan | |
| 5,393,994 A * | 2/1995 | Kobayashi et al. | ............. 257/84 |
| 5,404,373 A | 4/1995 | Cheng | |
| 5,892,786 A | 4/1999 | Lott | |
| 6,097,748 A | 8/2000 | Huang | |
| 7,376,169 B2 | 5/2008 | Henrichs | |
| 2003/0021322 A1 | 1/2003 | Steinle | |

FOREIGN PATENT DOCUMENTS
WO    2009074951 A2    6/2009

OTHER PUBLICATIONS

Olbright, G.R. et al "Cascadable Laser Logic Devices: Discrete Integration of Phototransistors with Surface-Emitting Laser Diodes" Electronics Letters, Jan. 1991, vol. 27, No. 3, pp. 216-217.

* cited by examiner

*Primary Examiner* — Yuanda Zhang

(57) ABSTRACT

It is an object of the present invention to improve the confinement of the carriers within a VCSEL. As a general concept of the invention, it is proposed to integrate a phototransistor layer structure into the layer stack of the VCSEL.

15 Claims, 4 Drawing Sheets

VERTICAL CAVITY SURFACE EMITTING LASER WITH ACTIVE CARRIER CONFINEMENT

FIELD OF THE INVENTION

The invention relates to vertical cavity surface emitting lasers (VCSELs) in general. More specifically, the invention concerns VCSELs having means for current confinement.

BACKGROUND OF THE INVENTION

For all semiconductor lasers it is very advantageous to confine the carrier injection as much as possible to the active area that contributes to the lasing activity. Carriers that are injected at spatial positions without overlap with the mode profile are lost. Thus, the better the carrier confinement, the higher is the overall efficiency.

A known measure for confinement of the current close to the center of a VCSEL is an aperture layer having a higher conductivity in the center of the cavity and a lower conductivity at its edge. An aperture layer can be realized by lateral oxidation of a high aluminum containing layer or by local proton implantation. However, the carrier injection for both approaches (oxidation and implantation) is not necessarily adapted to the lateral intensity profile of the optical mode.

SUMMARY OF THE INVENTION

Thus, it is an object of the present invention to improve the confinement of the carriers. This object is solved by the subject matter of claim 1. Advantageous refinements of the invention are defined in the dependent claims.

As a general concept of the invention, it is proposed to integrate a phototransistor layer structure into the layer stack of a VCSEL. If the laser emits light, the phototransistor becomes locally conductive so that carriers injection is laterally confined to areas where laser light transmits through the photosensitive layers of the phototransistor. Thus, the phototransistor provides a distributed active current confinement.

More specifically, a vertical cavity surface emitting laser diode (VCSEL), according to the invention comprises
  a substrate,
  a first layer stack of semiconducting layers on the substrate, the first layer stack forming a first distributed Bragg reflector,
  an active region comprising one or more quantum well layers arranged on the first layer stack,
  a second layer stack of semiconducting layers arranged on the active region, which forms a second distributed Bragg reflector, and
  first and second terminal contacts for injecting electrical current into the active region.

The vertical cavity surface emitting laser diode further comprises layers forming a distributed phototransistor sensitive to the laser light generated by the vertical cavity surface emitting laser diode. These layers comprise at least one base layer, at least one emitter layer and at least one collector layer. The at least one base layer is arranged between the at least one emitter layer and the at least one collector layer so that the current flowing in direction vertically to the substrate flows through the emitter layer, the collector layer and the base layer, and wherein the base layer is arranged between the lowest layer of the first layer stack nearest to the substrate and the topmost layer of the second layer stack.

The emitter and collector layers may advantageously be at least partly integrated into the layer stack of the VCSEL.

Thus, according to a refinement of the invention, at least one of the layers of the first layer stack forming a first distributed Bragg reflector or the second layer stacks forming a second distributed Bragg reflector form an emitter or a collector layer of the distributed phototransistor.

It is further advantageous, if the layers forming a distributed phototransistor, in particular, the base layer have a lateral conductivity which is lower than the conductivity in direction vertically to the layers in saturated state of the phototransistor. This avoids a large lateral spread of the photocurrent generated in the phototransistor. If the current spreads laterally, a punctual illumination of the base layer results in a larger area of the junctions becoming conductive so that the current confinement deteriorates.

Ideally, carriers will only be injected into the active area once the device is already lasing. To facilitate the initial injection of carriers, it is advantageous to provide a further contact in addition to the first and second terminal contacts. This contact is hereinafter referred to as a "starter electrode" or "starter terminal contact". The starter terminal contact, contacts a layer between the active region and the at least one base layer so that one junction of the phototransistor is at least partially bridged by connecting the starter terminal contact to a power supply for injecting carriers into the active region. As the junction is bridged, carriers can be injected via the starter terminal contact into the active region even if electrical current is blocked by the phototransistor due to absence of photons.

The starter terminal contact may be disconnected from the power supply once the VCSEL is lasing. Alternatively, the starter terminal contact may be electrically connected to one of the first and second terminal contacts. If the terminal contact is laterally offset to the central optical axis of the laser diode and the lateral conductivity is lower compared to the conductivity in vertical direction, the main current flows in vertical direction upon illumination of the base-collector junction with laser light.

Another additional or alternative possibility is to contact the base layer directly by a starter terminal contact. In this case, the phototransistor can be switched on by applying a suitable current to the base layer.

The layers of the distributed phototransistors may advantageously be layers of one of the distributed Bragg-reflector. Thus, according to a preferred refinement of the invention, at least one layer of the first or second layer stack forms an emitter or collector layer of the layers forming a distributed phototransistor.

Both PNP- or NPN-type phototransistors may be employed. In the case of a PNP-transistor, one of the first and second layer stacks forming a distributed Bragg reflector comprises p-doped layers and the layers forming a distributed phototransistor are embedded into or are adjacent to the layer stack comprising p-doped layers. Likewise, if the phototransistor is of the NPN-type, one of the first and the second layer stacks forming a distributed Bragg reflector comprises n-doped layers and the layers forming a distributed phototransistor are embedded into or adjacent to the layer stack comprising n-doped layers.

Generally, it is advantageous to locate the photoactive junction of the phototransistor at a position along the optical axis of the VCSEL, where the standing wave pattern has a high intensity. In this regard, it is preferred to locate the base layer at a position where the standing wave pattern of the laser light within the VCSEL has at least two thirds of its maximum value. In terms of layer pairs of the respective distributed Bragg-reflector in which the base layer is embedded, it is advantageous to locate the base layer at a distance to the active region, wherein the distance is of some mirror pairs of the Bragg-reflector. A mirror pair of the Bragg reflector is thereby constituted by two layers of different refractive index. Preferably, the distance is between two to fifteen layer pairs.

Similarly, the base layer may advantageously have an optical thickness of a quarter wavelength of the laser light emitted by the VCSEL and may be embedded into the first or second layer stack which form a distributed Bragg reflector. This way, the base layer becomes effective as a reflecting layer of the respective distributed Bragg reflector.

According to an alternative embodiment of the invention, the base layer is smaller than a quarter wavelength optical thickness. Preferably, in this embodiment, the base layer has an optical thickness less than an eighths of the laser wavelength. If in this embodiment the base layer is located within one of the layer stacks forming the distributed Bragg-reflectors, the thickness of one of the adjacent layers may advantageously be adapted to the base layer thickness so that the phase relation of the partial waves reflected at the interfaces of the respective layer stack remains correct for a reflection of the laser mode. Of course, this is easily achieved, if the thicknesses of the base layer and one of the adjacent layers of the layer stack forming a distributed Bragg reflector sum up to an optical thickness of about a quarter wavelength. A thinner base layer may be advantageous to reduce the absorption in the distributed phototransistor.

If the gain of the phototransistor is very high, the transistor may become locally saturated even in areas where the light intensity is low. It is therefore advantageous to choose a low to moderate gain, or to avoid very high gains. Preferably, the phototransistor is designed to have a gain of less than 500.

On the other hand, it is advantageous to design the phototransistor and arrange its position so that the phototransistor does become locally saturated within an area around the maximum light intensity along the base layer. Suitably, this area should not spread along the whole lateral dimensions of the cavity. For example, the phototransistor can be designed so that it becomes saturated within an area of at most the size defined by the FWHM of the lateral light intensity distribution.

If the phototransistor is locally saturated, the current through the laser diode is not strictly proportional to the light intensity. Thus, the driving current may not be a reliable parameter to monitor the laser output. However, if the base layer is provided with a terminal contact, the photocurrent generated in the base-collector junction can be measured with a monitor circuit connected to the base layer and the at least one collector layer. For the connection of the circuit to the collector layer, either the first or the second terminal contact for injecting electrical current may be used, depending on which of these contacts is on the same side of the collector layer with respect to the base layer. This configuration has also the advantage that a small current can be injected through these contacts to switch the phototransistor and thereby enabling the injection of carriers through the first and second terminal contacts so as to start the lasing operation.

Besides the effect of an improved efficiency, the invention has the further benefit that the distributed phototransistor also generally improves the beam quality. This is due to the fact that the phototransistor provides a positive feedback to the lateral intensity distribution so that modes having higher intensity are further enhanced. As well, the current aperture which is often used for carrier confinement in general has a lateral refractive index variation which leads to a lateral guidance of optical modes. This in turn increases the tendency for multimode lasing. As an oxide aperture can be omitted according to the invention, this disadvantage of existing VCSELs is avoided. Thus, a laser device according to the invention is expected to have improved single mode features such as a higher single mode output power and a smaller far field angle. The smaller far field angle particularly results from the lack of a lateral refractive index variation which is otherwise induced by the oxide aperture.

These advantages similarly apply to a device according to the invention lasing in multimode. For multimode lasing, an improved $M^2$-factor is expected.

The invention is advantageously applicable for high-power top or bottom emitting VCSELs. As the adaptive current confinement provides an improved mode-selectivity, the invention is further particularly suited to realize single-mode VCSELs. Furthermore, it is possible to provide a simplified self-mixing interference sensor with an inventive VCSEL device. In contrast to known interference sensor devices which employ a monitor photodiode, the self-mixing signal can be easily extracted from the laser voltage. Thus, the VCSEL of this device needs only two terminal contacts for operation and measurement, namely the first and second terminal contacts for carrier injection. Circuitry is provided which measures an alternating portion of the voltage across the first and second terminal contacts. The alternating portion predominantly results from the light intensity dependent conductance of the phototransistor. Thus, the phototransistor can also serve as an amplifying element to amplify variations in laser current and voltage induced by self-mixing interference in the laser cavity. In particular, if the phototransistor is operated in the non-saturated regime, a strong dependence of the laser voltage to the light output occurs.

According to a further embodiment in addition or as alternative to the above mentioned interference sensor, the distributed phototransistor may also advantageously work as a switch which automatically switches between at least two VCSEL electrically connected in parallel, in particular if one of the VCSELs has a failure. This is due to the fact that the light emission dependent amplification of the phototransistors in the VCSELs results in a highly enhanced conductivity through that VCSEL which starts lasing at first. The conductivity through the other phototransistor remains low, so that the current nearly exclusively flows through that VCSEL which starts lasing first and lasing of the other VCSEL is prohibited due to lack of carriers. If, however, the lasing VCSEL fails, the next VCSEL will start lasing. This automatic switching behavior can be achieved most simply with VCSELs having starter terminal contacts bridging one junction of the phototransistor to effectuate self-starting capability of the VCSELs.

Thus, according to this refinement of the invention, a VCSEL device is provided comprising at least two VCSELs, each VCSEL comprising layers forming a distributed phototransistor sensitive to the laser light generated by said vertical cavity surface emitting laser diode, whereby the layers forming a distributed phototransistor comprise at least one base layer, at least one emitter layer and at least one collector layer, and a starter terminal contact bridging at least one junction of the respective phototransistor. The first and second terminal contacts for injecting electrical current into the active region of the VCSELs are jointly connected, e.g. to shared terminal contacts on a chip.

DETAILED DESCRIPTION OF EMBODIMENTS

Figure 1:
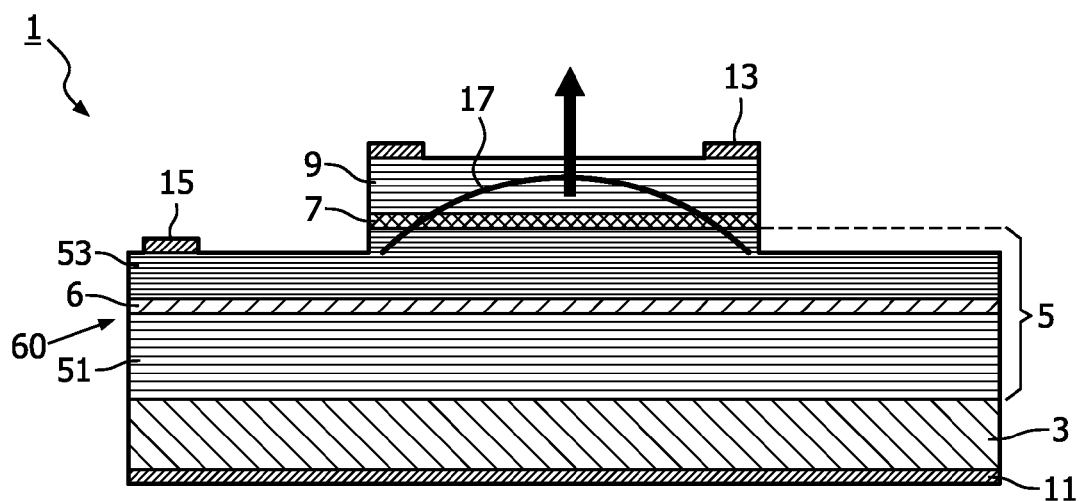
FIG. 1 shows a first embodiment of a vertical cavity surface emitting laser diode device with a distributed NPN-phototransistor.

FIG. 1 shows a schematic of a VCSEL device 1 with an integrated NPN-phototransistor for adaptive carrier confinement. The VCSEL device 1 comprises a substrate 3, and thereon a first layer stack of semiconducting layers which forms a first distributed Bragg reflector 5, an active region 7 with one or more quantum well layers, and a second layer stack of semiconducting layers forming a second distributed Bragg reflector 9.

A suitable and frequently used material for the substrate is gallium arsenide, GaAs. However, other materials such as indium phosphide (InP) or GaInAsN can be used as well.

If GaAs is used as the substrate material, the distributed Bragg reflectors 5, 9 can be fabricated by alternating epitaxial growing GaAs and AlGaAs layers. If the substrate is negatively doped, the lower or first distributed Bragg reflector 5 is negatively doped as well, whereas the upper or second distributed Bragg reflector is positively doped. The second distributed Bragg reflector 9 is designed as a semitransparent mirror so that a predetermined quantity of the laser light is coupled out at this reflector. For this purpose, the second distributed Bragg reflector 9 comprises fewer alternating layers pairs compared to the first distributed Bragg reflector 5. For example, the first and second Bragg reflectors 5, 9 may be built from 35 and 28 GaAs/AlGaAs layer pairs, respectively. As the light is coupled out through the upper Bragg reflector, the example of FIG. 1 is a top emitting VCSEL. Of course, it is also possible to design the first distributed Bragg reflector as coupling element so that the outcoupled laser light is transmitted through the substrate 3.

To inject the carriers into the cavity formed by the distributed Bragg reflectors 5, 9, a first terminal contact 11 and a second terminal contact 13 are provided. The first terminal contact 11 is a metal layer disposed on the backside of substrate 3. The second terminal contact 13 is formed as a ring electrode so that the outcoupled laser light can be transmitted through the centre of the ring.

In the example of FIG. 1, the layer stack forming the first distributed Bragg reflector 5 is interrupted by a base layer 6 which forms the base of a distributed phototransistor 60. Thus, the base layer 7 subdivides the layer stack of Bragg reflector 5 into layer stacks 51, 53.

Figure 2:
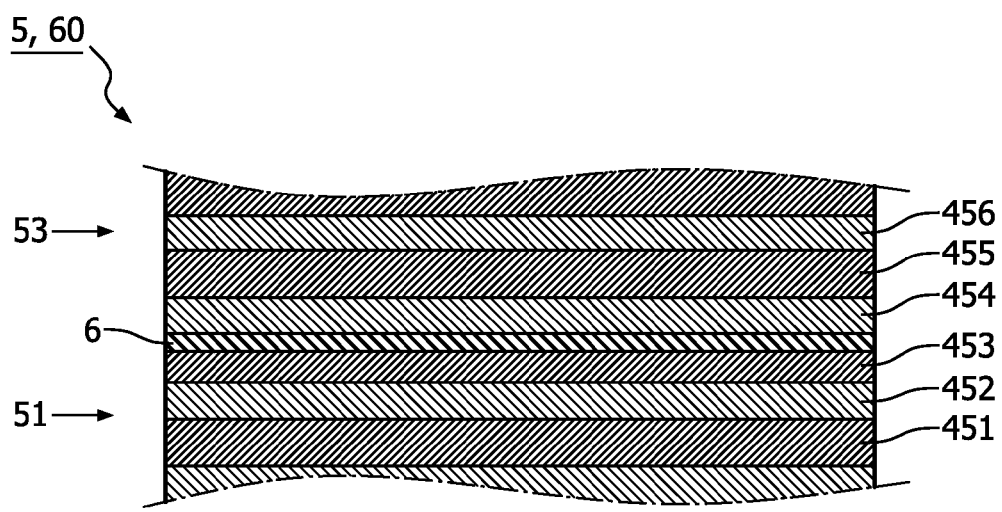
FIG. 2 shows an embodiment of a distributed phototransistor with a thin base layer.

However, the base layer itself may advantageously have an optical thickness of a quarter wavelength of the laser light emitted by the VCSEL device 1. This way, the base layer can optically function as a part of the mirror formed by the distributed Bragg-reflector. Alternatively, a base layer is employed having an optical thickness of less than a quarter wavelength. For example, the thickness may be between 5 to 25 nanometers. FIG. 2 shows an example of a distributed phototransistor 60 embedded into layer stack 5 this way. The layer stack 5 comprises a first type of layers 451, 453, 455 and a second type of layers 452, 454, 456. The first and second type of layers differ in their refractive index. However, each of the layers has an optical thickness of one quarter wavelength to form a Bragg reflector. The thickness of the base layer 6 is considerably smaller, e.g. of less than an eighth of a wavelength. To maintain the phase relation between the partial waves reflected at the interfaces, one layer 453 of the layer stack adjacent to the base layer 6 may have a thickness which is reduced by the thickness of the base layer 6 so that the optical thicknesses of the base layer 6 and the adjacent layer 453 again sum up to a thickness of a quarter wavelength.

The layers of stacks 51 and 53 adjacent to the base layer 6 form emitter and collector layers of the phototransistor. As the layer stacks 51, 53 are n-doped, the distributed phototransistor is designed as an NPN-transistor. Accordingly, the layers of stack 53 form the collector and the layers of stack 51 form the emitter and the base layer 6 is p-doped.

If the VCSEL is lasing, the light intensity varies along the base layer 6 according to the mode profile of the laser beam. A desired mode profile 17 having its maximum intensity at the optical axis is schematically shown in FIG. 1. The light will induce a photocurrent in the base-collector junction which in turn controls the local current through the phototransistor so that the driving current is low or zero along areas of the phototransistor which are not illuminated. Thus, the distributed phototransistor embedded into the cavity of the VCSEL provides a simple and effective adaptive current confinement.

The position of the base layer 6 within the subsequence of layers is preferably chosen so that the standing wave pattern of the desired lasing mode has a high intensity at the base layer. Preferably, the base layer 6 is located at a position where the standing wave pattern of the laser light within the cavity of the VCSEL has at least two thirds of its maximum value.

In difference to FIG. 1, it is also possible to place its collector layer adjacent to the active region. In this case, a high light intensity is ensured. Furthermore, the adaptive confinement is most effective close to the active region since a lateral spread of the current between the phototransistor and the active region 7 is minimized.

On the other hand, the collector-basis junction acts as a photodiode and consequently absorbs light. Thus, as shown in FIG. 1, a good position for the base layer is some mirror pairs away from the active area 7 to achieve high overall performance. Generally, without restriction to the specific embodiment shown in FIG. 1, it is advantageous to embed the base layer within one of the layer stacks 5, 9 forming the first and second distributed Bragg-reflectors, respectively, so that the layer stack is divided into two sub-stacks by the base layer 6, wherein the sub-stack proximal to the active region is thinner than the sub-stack distal to the active region. Preferably, the thickness of the sub-stack proximal to the active region is within the range of two fifths to one eighth of the thickness of the sub-stack distal to the active region. For example, the layer stack 53 may have a thickness of 2 to 15 layer pairs and the layer stack 51 may consist of 20 to 30 further layers.

The VCSEL comprises a starter terminal contact 15 in addition to the first and second terminal contacts 11, 13. The starter terminal contact 15 contacts a layer of layer stack 53 between the active region 7 and the base layer 6 and is located laterally offset to the central optical axis of the VCSEL. Thus, if the power supply for injecting the carriers into the cavity is connected to starter terminal contact 15 and second terminal contact 13, the base and the base-emitter junction are bridged. This way, the injected current can enter the active region by flowing laterally through layer stack 53. This way, the laser operation can be started although the phototransistor is closed.

Further, if the layers forming a distributed phototransistor have a lateral conductivity being lower than the conductivity in direction vertically to the layers in saturated state of the phototransistor, the main current will flow between the terminal contacts 11 and 13 even if the starter terminal contact 15 and the first terminal contact 11 remain connected after the laser operation has been started. Thus, according to a simple embodiment of the invention, the starter terminal contact and the first terminal contact can be permanently short-circuited.

Figure 3:
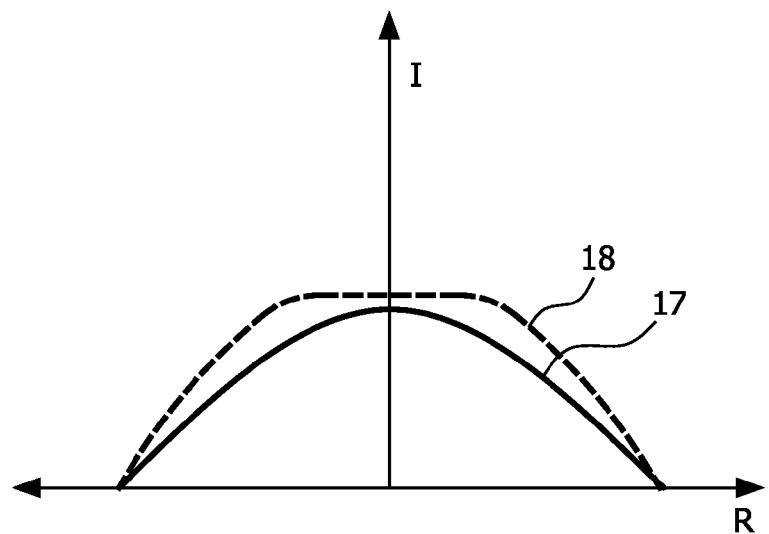
FIG. 3 shows a diagram of the mode profile and the local conductivity of the distributed phototransistor.

FIG. 3 shows a diagram of the light intensity and the current density through the phototransistor. The origin of the abscissa is given by the optical axis of the VCSEL. The light intensity is represented by the mode profile already shown in FIG. 1. The intensity of the mode profile 17 decreases from its maximum at the optical axis (at radius R=0) towards the edge of the cavity. Likewise, the local current density 18 transmitted by the phototransistor increases from the edge of the cavity towards the optical axis.

As can be seen from the plateau in the current density near the optical axis, the phototransistor becomes saturated at a certain light intensity. This is advantageous to allow for a nearly unhindered transmission of carriers at the center of the VCSEL. Thus, the phototransistor is preferably designed to have a gain factor which is large enough so that it becomes saturated at least at the maximum intensity of the desired lasing mode. However, if a very high gain would be chosen, the course of the current density would approach a square shape and maximum current density would be injected into the active region even in areas with low light intensity. Therefore, the gain factor is preferably chosen to be 500 at the most. Depending on the desired mode profile, suitable gain factors may range from 5 to 500.

On the other hand, whether a phototransistor becomes saturated also depends on the photoabsorption. If thin base layers are chosen which have only small absorption, the gain can be chosen to be higher than 500. In this context, a low absorption in the photoactive region of the phototransistor is regarded as an absorption of less than 5% of the laser light per transmission. The latter feature of less than 5% absorption per transmission of a laser light ray is advantageous in general and may also apply to phototransistors having a lower gain. A low absorption in the photoactive region of the distributed phototransistor is advantageous in general to maintain a high quality of the laser cavity or the respective Bragg-reflectors.

Figure 4:
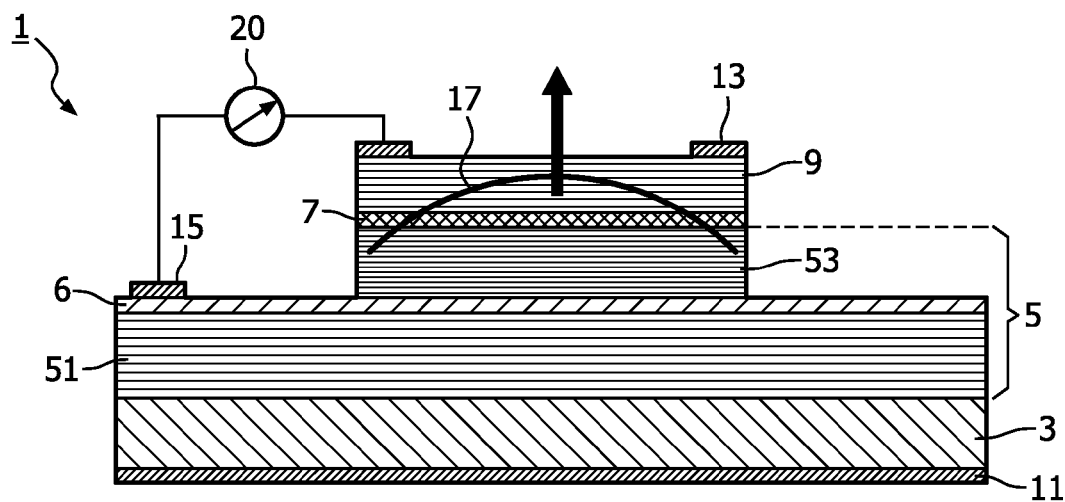
FIGS. 4 and 5 show variants of the embodiment of FIG. 1.

FIG. 4 shows a variant of the embodiment of FIG. 1. According to this variant of a VCSEL device 1, the starter terminal contact 15 is deposited onto the base layer 6. This allows to control the phototransistor by applying a current to the base layer 6 via starter terminal contact 15 much like a conventional transistor. In particular, by applying a voltage between terminal contacts 13 and 15, the phototransistor can be switched so that a current can flow between terminal contacts 11 and 13, thereby starting the laser operation. Furthermore, a monitor circuit 20 can be connected to the base layer 6 via starter terminal contact 15 and to terminal contact 13 so that the monitor circuit measures the photocurrent generated in the base-collector junction of the phototransistor. The monitored photocurrent can in turn be used as an input for a stabilization circuit which stabilizes the light intensity.

In difference to the exemplary embodiments discussed above, the base layer 6 may also be embedded in the second layer stack forming the upper distributed Bragg-reflector 9. Furthermore, in the embodiments as shown in FIGS. 1 and 3, a positively doped substrate 3 and a likewise positively doped first distributed Bragg-reflector 5 may be used. The base layer 6 embedded in the first distributed Bragg reflector 5 is n-doped in this case, so that a PNP-phototransistor is realized.

Figure 5:
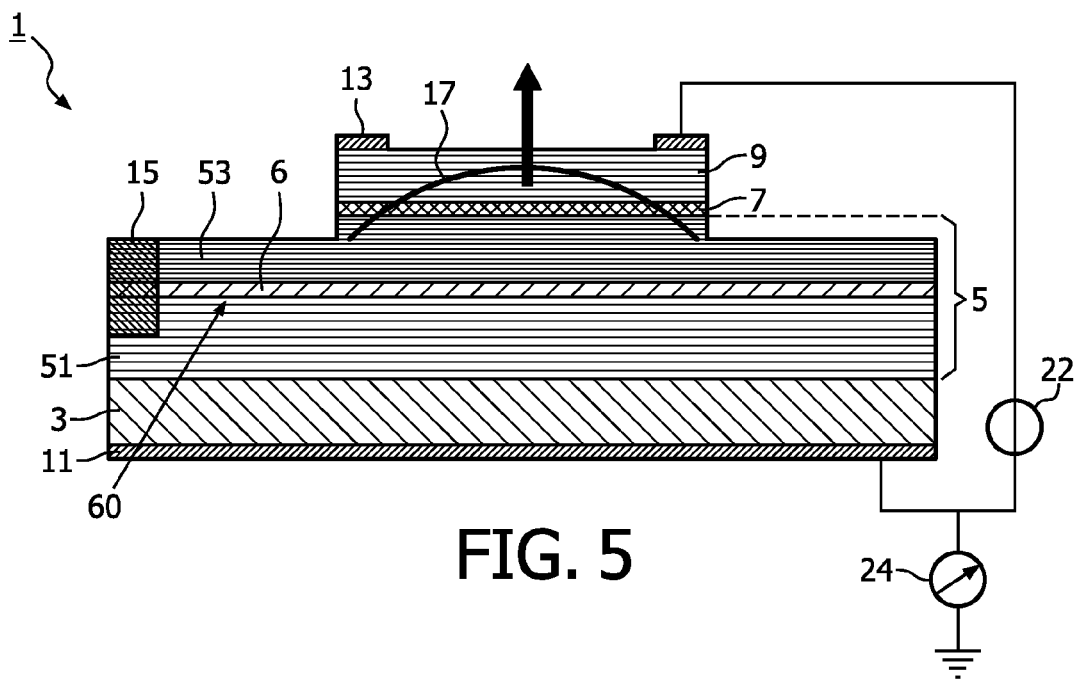

FIG. 5 shows a further variant of the VCSEL device 1. Specifically, a self-mixing interference sensor with only two electrical connections to the VCSEL is realized. Similarly to the embodiment of FIG. 1, a starter electrode 15 is provided which bridges the collector-basis junction of the phototransistor 60. In this embodiment, the bridging is not accomplished by short-circuiting the first terminal contact 11 and the starter electrode 15. Rather, the starter electrode 15 contacts layers of both layer stacks 51 and 53. However, for the working principle of the self-mixing interference sensor the embodiment of FIG. 1 with the starter electrode 15 and first terminal contact 11 short-circuited works as well. The VCSEL is contacted to a current supply via the first and second terminal contacts 11, 13. There is no need for further electrical contacts to obtain a signal representative for the intensity oscillations of the VCSEL caused by self-mixing interference in the laser cavity. An AC voltage measuring circuit 24 measures the alternating portion of the laser voltage, e.g. as shown, with respect to ground potential or another reference potential.

Figure 6:
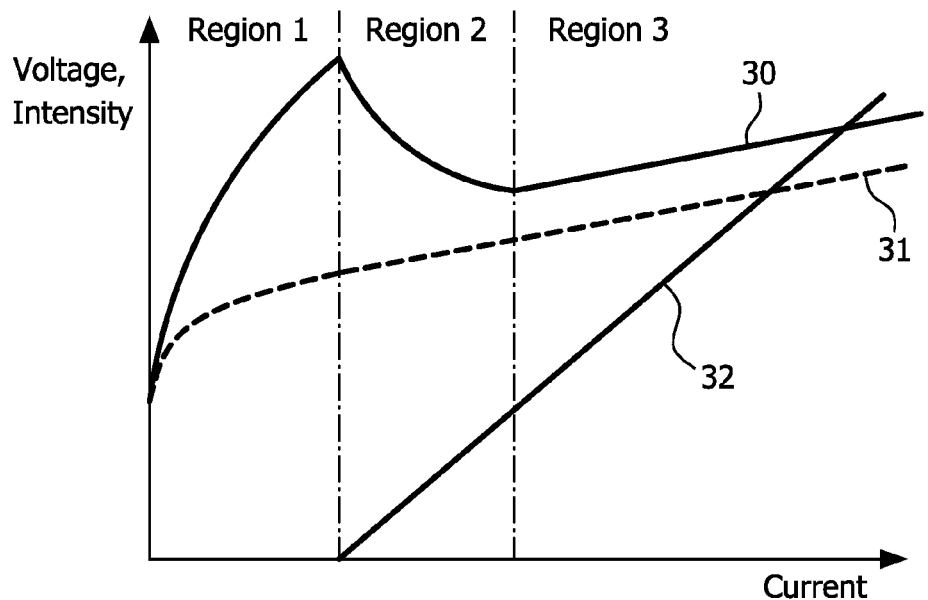
FIG. 6 shows a graph of the voltage and intensity characteristics of the device according to FIG. 5.

A strong alternating voltage portion superpositioned to the laser voltage is obtained if the VCSEL is operated at a current or intensity where the distributed phototransistor 60 works below saturation. This is explained in more detail with respect to FIG. 6. FIG. 6 shows the characteristics of the voltage 30 and the characteristics of the laser intensity 32 as a function of the laser current. For comparison, the characteristics 32 of the voltage of a common VCSEL is shown.

As can be seen from characteristics 32, the voltage is steadily rising with increasing laser current in case of a common VCSEL without distributed phototransistor. If the lasing threshold is reached at a certain current, the laser intensity or power, respectively, increases nearly linearly with the laser current. This also holds for a device according to the invention. However, as can be seen from characteristics 30, the voltage applied to the terminal contacts 11, 13 is no more increasing monotonically with the laser current.

More specifically, three regions can be distinguished within the voltage characteristics 30. At low currents below the lasing threshold (region 1), the voltage is increasing considerably stronger compared to a common VCSEL. This is due to the phototransistor which is switched off and locks the current path vertically through the layers of distributed Bragg-reflector 5. The laser current can only flow laterally via the starter electrode. As the conductivity for this current path is much lower than the conductivity vertically through the layer stack, a higher voltage drop occurs. If the lasing threshold is reached, the phototransistor becomes conductive due to the laser light. This results in a voltage drop across the phototransistor which overcompensates the increase in voltage over the other layers of the VCSEL. Thus, in region 2 the laser voltage decreases with increasing current. If the laser intensity becomes sufficient to saturate the phototransistor (region 3), the characteristics approaches the characteristics of a common VCSEL. However, the voltage of an inventive VCSEL is offset by the voltage drop across the junctions of the phototransistor. Thus, the characteristics of a common and an inventive VCSEL in region 3 are similar but offset.

As the rate of change of the voltage as a function of the laser corrent is particularly strong within region 2, the VCSEL can be operated within this region to obtain a strong self-mixing oscillation in the laser voltage.

As only two terminal contacts are needed to connect the VCSEL to the circuitry, the overall size of the VCSEL chip can be considerably reduced since the terminal contact areas are large compared to the area covered by the VCSEL mesa.

Figure 7:
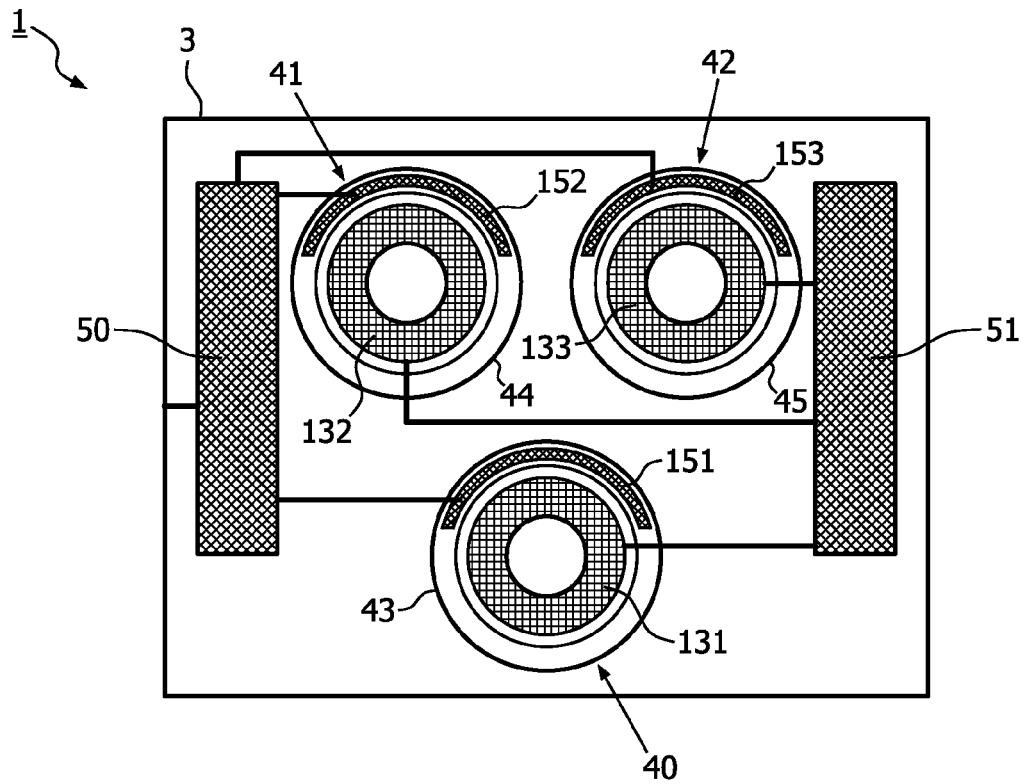
FIG. 7 depicts an embodiment with three VCSELs on a shared substrate.
Figure 8:
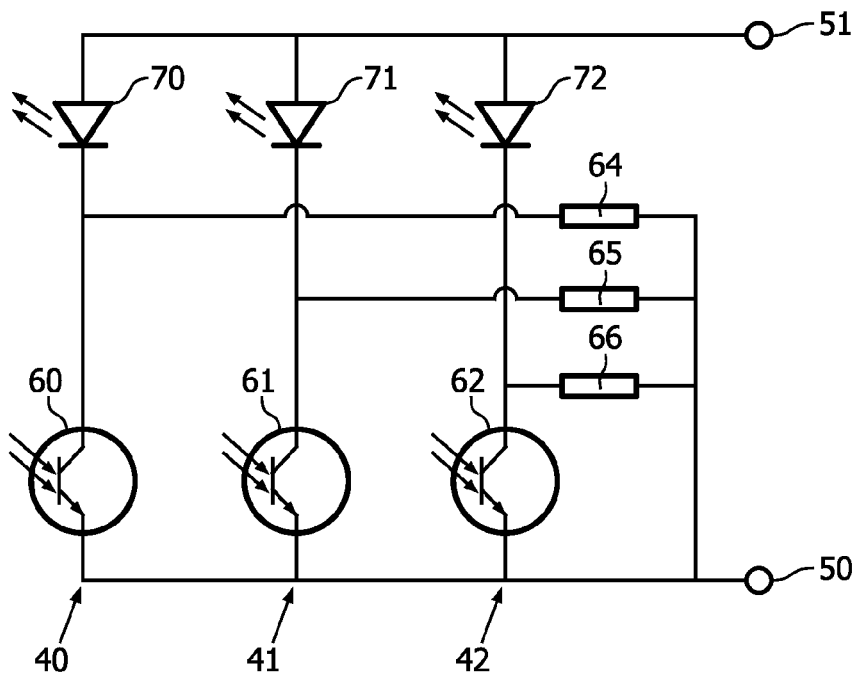
FIG. 8 shows an equivalent circuit diagram of the embodiment of FIG. 7.

The phototransistor can further advantageously be used to provide automatic switching means to select one VCSEL to continue operation if another VCSEL has a failure. FIG. 7 shows an example of this embodiment and FIG. 8 shows an equivalent circuit diagram thereof. The VCSEL device 1 according to this embodiment comprises three VCSELs 40, 41, 42 formed from mesas 43, 44, 45 on a substrate 3. Two terminal contact pads 50, 51 are deposited on the substrate 3. The starter electrodes 151, 152, 153 are jointly connected to a first terminal contact pad 50. This terminal contact pad 50 is further connected to the backside of substrate 3 where a first electrode 11 similar to the embodiments of FIGS. 1, 4 and 5 is arranged which is thus shared by all VCSELs 40, 41, 42. The second terminal contacts 131, 132, 133 are jointly connected to a second terminal contact pad 51. For operation, the supply current is applied to the terminal contact pads 50, 51.

In the equivalent circuit diagram, resistors 64, 65, 66 represent the higher resistance in the current path from the starter electrodes 151, 152, 153. These resistors are commonly connected to terminal contact pad 50 and between the phototransistors 60, 61, 62 and the active regions 70, 71, 72 of the respective VCSELs 40, 41, 42. If a voltage is applied to terminal contact pads 50, 51, the current initially flows through the active regions via the resistors 64, 65, 66 or starter electrodes 150, 151, 152, respectively. In general, the laser thresholds of the VCSELs will be slightly different. Thus, one of the VCSELs 40, 41, 42 will then start lasing prior to the other VCSELs. The respective phototransistor of the lasing VCSEL then switches so that the current mainly flows through the phototransistor thereby decreasing the overall resistance of the current path through the lasing VCSEL. Consequently, the laser current mainly flows through the VCSEL which already started lasing and it is avoided that the lasing threshold of one of the other VCSELs is reached. However, if the lasing VCSEL fails, the respective phototransistor 60, 61 or 62 blocks the current so that the next VCSEL is automatically switched on by reaching its lasing threshold. Accordingly, the integrated phototransistors allow for a very simple redundant laser device. For example, the VCSEL device according to FIG. 7 may be used as a highly reliable movement sensor if used as a self-mixing sensor similarly to the embodiment of FIG. 5.

Although preferred embodiments of the present invention have been illustrated in the accompanying drawings and described in the foregoing description, it will be understood that the invention is not limited to the embodiments disclosed but is capable of numerous modifications without departing from the scope of the invention as set out in the following claims.

The invention claimed is:

1. A vertical cavity surface emitting laser diode device, comprising
    a substrate;
    a first layer stack of semiconducting layers on said substrate, said first layer stack forming a first distributed Bragg reflector;
    an active region comprising one or more quantum well layers on said first layer stack;
    a second layer stack of semiconducting layers on said active region, said second layer stack forming a second distributed Bragg reflector;
    first and second terminal contacts for injecting electrical current into said active region; and,
    layers forming a distributed phototransistor sensitive to the laser light generated by said vertical cavity surface emitting laser diode, said layers forming the distributed phototransistor which in use provides a distributed active current confinement, the distributed phototransistor comprising at least one base layer, at least one emitter layer and at least one collector layer, said at least one base layer being arranged between said at least one emitter layer and said at least one collector layer so that the current flowing in direction vertically to said substrate flows through said emitter layer, said collector layer and said base layer, and wherein said base layer is arranged between the lowest layer of said first layer stack nearest to said substrate and the topmost layer of said second layer stack.

2. The vertical cavity surface emitting laser diode device according to claim 1, wherein at least one of the layers of said first layer stack forming the first distributed Bragg reflector or said second layer stacks forming the second distributed Bragg reflector form an emitter or a collector layer of said phototransistor.

3. The vertical cavity surface emitting laser diode device according to claim 1, characterized in that said layers forming the distributed phototransistor have a lateral conductivity being lower than the conductivity in direction vertically to said layers in saturated state of said phototransistor.

4. The vertical cavity surface emitting laser diode device according to claim 1, comprising a starter terminal contact in addition to said first and second terminal contacts, said starter terminal contact contacting said base layer or a layer between the active region and said at least one base layer so that one junction of said phototransistor is at least partially bridged by connecting said starter terminal contact to a power supply for injecting carriers into said active region.

5. The vertical cavity surface emitting laser diode device according to any preceding claim, wherein said starter terminal contact contacts said layer between the active region and said at least one base layer laterally offset to the central optical axis of said vertical cavity surface emitting laser diode device.

6. The vertical cavity surface emitting laser diode device according to any preceding claim, wherein said starter terminal contact is electrically connected to one of said first and second terminal contacts for injecting the electrical current into the cavity of said vertical cavity surface emitting laser diode device.

7. The vertical cavity surface emitting laser diode device according to claim 4, comprising at least two vertical cavity surface emitting laser diodes, each vertical cavity surface emitting laser diode comprising layers forming a distributed phototransistor sensitive to the laser light generated by said vertical cavity surface emitting laser diode, the layers forming a distributed phototransistor comprising at least one base layer, at least one emitter layer and at least one collector layer, said vertical cavity surface emitting laser diodes each comprising a starter terminal contact bridging at least one junction of the respective phototransistor, wherein the first terminal contacts for injecting electrical current into the active region of said vertical cavity surface emitting laser diodes are jointly connected and the second terminal contacts for injecting electrical current into the active region of said vertical cavity surface emitting laser diodes are jointly connected.

8. The vertical cavity surface emitting laser diode device according to claim 1, wherein one of said first and said second layer stacks forming the first and second distributed Bragg reflector comprises p-doped layers and said layers forming the distributed phototransistor are embedded into or are adjacent to said layer stack comprising p-doped layers, and wherein said layers forming a distributed phototransistor form a PNP-transistor.

9. The vertical cavity surface emitting laser diode device according to claim 1, wherein one of said first and said second layer stacks forming the first and a second distributed Bragg reflector comprises n-doped layers and said layers forming the distributed phototransistor are embedded into or adjacent to said layer stack comprising n-doped layers, and wherein said layers forming a distributed phototransistor form a NPN-transistor.

10. The vertical cavity surface emitting laser diode device according to claim 1, wherein said base layer is located at a position where the standing wave pattern of the laser light within said vertical cavity surface emitting laser diode device has at least two thirds of its maximum value.

11. The vertical cavity surface emitting laser diode device according to claim 1, wherein said base layer located at a distance to said active region, said distance being between two to fifteen layer pairs of one of said first and second distributed Bragg-reflector.

12. The vertical cavity surface emitting laser diode device according to claim 1, wherein said base layer is embedded within one of said first and second layer stacks forming the first and second distributed Bragg-reflectors, respectively, so that the layer stack is divided into two sub-stacks by said base layer, wherein the sub-stack proximal to said active region is thinner than the sub-stack distal to said active region.

13. The vertical cavity surface emitting laser diode device according to claim 1, wherein said base layer is embedded in one of said first and said second layer stacks forming the first and second distributed Bragg reflector and having an optical thickness of less than a quarter wavelength, and wherein the thicknesses of said base layer and one of the adjacent layers of the layer stack forming one of the first and second distributed Bragg reflectors in which said base layer is embedded sum up to an optical thickness of about a quarter wavelength of said laser light.

14. The vertical cavity surface emitting laser diode device according to claim 1, wherein said phototransistor is designed so that it becomes locally saturated within an area around the maximum light intensity along the base layer.

15. A self-mixing interference sensor device comprising a vertical cavity surface emitting laser diode device according to claim 1, said self-mixing interference sensor device comprising circuitry for measuring an alternating portion of a voltage across said first and second terminal contacts.

* * * * *